United States Patent
Chen

(10) Patent No.: US 6,353,534 B1
(45) Date of Patent: Mar. 5, 2002

(54) NETWORK INTERFACE CARD FRAME

(75) Inventor: Wen-Yen Chen, Taipei (TW)

(73) Assignee: Teconn Electronics Inc., Taipei (TW)

( * ) Notice: Subject to any disclaimer, the term of this patent is extended or adjusted under 35 U.S.C. 154(b) by 8 days.

(21) Appl. No.: 09/630,589

(22) Filed: Aug. 1, 2000

(51) Int. Cl.[7] ............................................. H04K 1/14

(52) U.S. Cl. ...................... 361/684; 361/736; 361/737; 439/76.1; 174/35 R; 29/841

(58) Field of Search ................................ 361/683, 684, 361/736–737, 816, 818, 728, 752, 785, 720, 721, 719, 748, 740–741, 747, 810; 439/76.1, 101, 108, 946, 607, 609, 59, 62, 73, 64, 142, 188, 352, 65, 94.5, 629; 257/679, 723, 678; 235/492, 486, 487, 495; 174/52.1, 35 R; 902/26; 29/840–842, 825, 832

(56) References Cited

U.S. PATENT DOCUMENTS

| | | | | |
|---|---|---|---|---|
| 5,505,628 A | * | 4/1996 | Ramey et al. | 439/76.1 |
| 5,994,769 A | * | 11/1999 | Onoda et al. | 257/679 |
| 6,115,257 A | * | 9/2000 | Laity | 361/737 |

* cited by examiner

Primary Examiner—Leo P. Picard
Assistant Examiner—Michael Datskovsky
(74) Attorney, Agent, or Firm—Jacobson Holman, PLLC

(57) ABSTRACT

A network interface card (NIC) frame contains a plastic frame, an upper cover, two metal plates and two lateral metal bars. A PC board is mounted into the plastic frame first and then the two metal plates are covered on the top and bottom of the PC board respectively. Afterwards, the lateral metal bar is arranged on the groove of the two lateral sides of the plastic frame and then the fingers on the lateral metal bar are inserted into the corresponding buckle holes on the fasten teeth of the metal plates respectively. The NIC frame can be taken apart and reused repetitively for the purpose of adjustment or repairing the PC board inside.

1 Claim, 4 Drawing Sheets

NETWORK INTERFACE CARD FRAME

BACKGROUND OF THE INVENTION

1. Field of the Invention

The present invention relates to a Network interface card (NIC) frame, more particularly, to a frame of Network interface card with the function of repeat dismantling and assembling, wherein the core PC board of network interface card can be adjusted or repaired from time to time by means of dismantling the frame set. Especially to those wireless network interface cards, the frame needs to be opened for protocol adjustment.

2. Description of the Prior Art

A conventional NIC frame contains a PC board covered by a cassette frame set, wherein the cassette frame includes a top cover and a bottom cover, each having a metal plate thereof to prevent electronic or magnetic interference. As the structure mentioned above, the frame is so thin that normally the metal plates are produced by drawing and then integrated into each plastic cover by modeling. Thereafter, the top cover is joined to the bottom cover by high frequency heating, hot melt gluing or model compressing. Therefore, the conventional NIC frame can not be opened or taken apart once the top and bottom covers being assembled. If the NIC frame is opened after assembling, it is damaged and can't be used any more. Whereas during the production of the network interface card, the PC board always need to be tested and adjusted after being assembled due to the inaccuracy of testing results existing before and after assembling of the NIC frame. Especially for wireless Network interface card, it is in badly need of test and minor adjustment after sealing the frame. Accordingly, a NIC frame having the function of repetitive dismantling and assembling is necessary.

In addition, the conventional NIC frame has a sealing gap between the two metal plates. Although the gap is as small as a line and wrapped by plastic frame, there is still a little amount of electromagnetic wave leaking out of the gap so as to cause interference. Such kind of problem is also needed to be resolved.

SUMMARY OF THE INVENTION

It is therefore a primary object of the present invention to provide a NIC frame which is able to be taken apart repetitively so that the PC board inside can be tested and adjusted after the frame being assembled.

It is a further object of the present invention to provide a NIC frame with lateral metal bars to fasten the sealing gap between two lateral edges of the metal plates of the top and bottom covers for tight conjunction.

It is another object of the present invention to provide a NIC frame which can be taken apart and reused repetitively for the purpose of adjustment or repairing so as to reduce manufacturing cost.

In order to accomplish the above-mentioned objects, the present invention contains a plastic frame, an upper cover, two metal plates and two lateral metal bars. A groove and several longitudinal holes are disposed on each outer lateral side of the plastic frame. And the longitudinal holes are arranged to the top of the lateral side of the frame. On the bottom of groove, several pairs of bilateral hole are mounted thereof, penetrating the lateral side of the plastic frame to reach the above mentioned longitudinal holes. On both lateral sides of each metal plate, a downward folding rim contains several fasten teeth corresponding to each longitudinal holes of the plastic frame, and each tooth has a buckle hole. The lateral metal bar is used to affix at the groove of both sides of the plastic frame. Several fingers are arranged perpendicular to both edges of the lateral metal bar and corresponding to the buckle holes on metal folding rim of the metal plate. The finger has a protruding bead on the center thereof. In accordance with the structure mentioned above, the PC board is mounted into the plastic frame first and the two metal plates are covered on the PC board. Afterwards, the lateral metal bar is arranged on the groove of the plastic frame and then the fingers are inserted into the corresponding bilateral hole, penetrating the lateral side of the plastic frame to reach the above mentioned longitudinal holes. The protruding bead can be fastened with the buckle hole.

When in use, NIC frame in accordance with the present invention can be easily dismantled by buckles and fingers. In addition, the PC board inside the NIC frame of the present invention is double-protected by the two lateral metal bars clamped on the sealed edge of the two metal plates.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DETAILED DESCRIPTION OF THE PREFERRED EMBODIMENT

Figure 1:
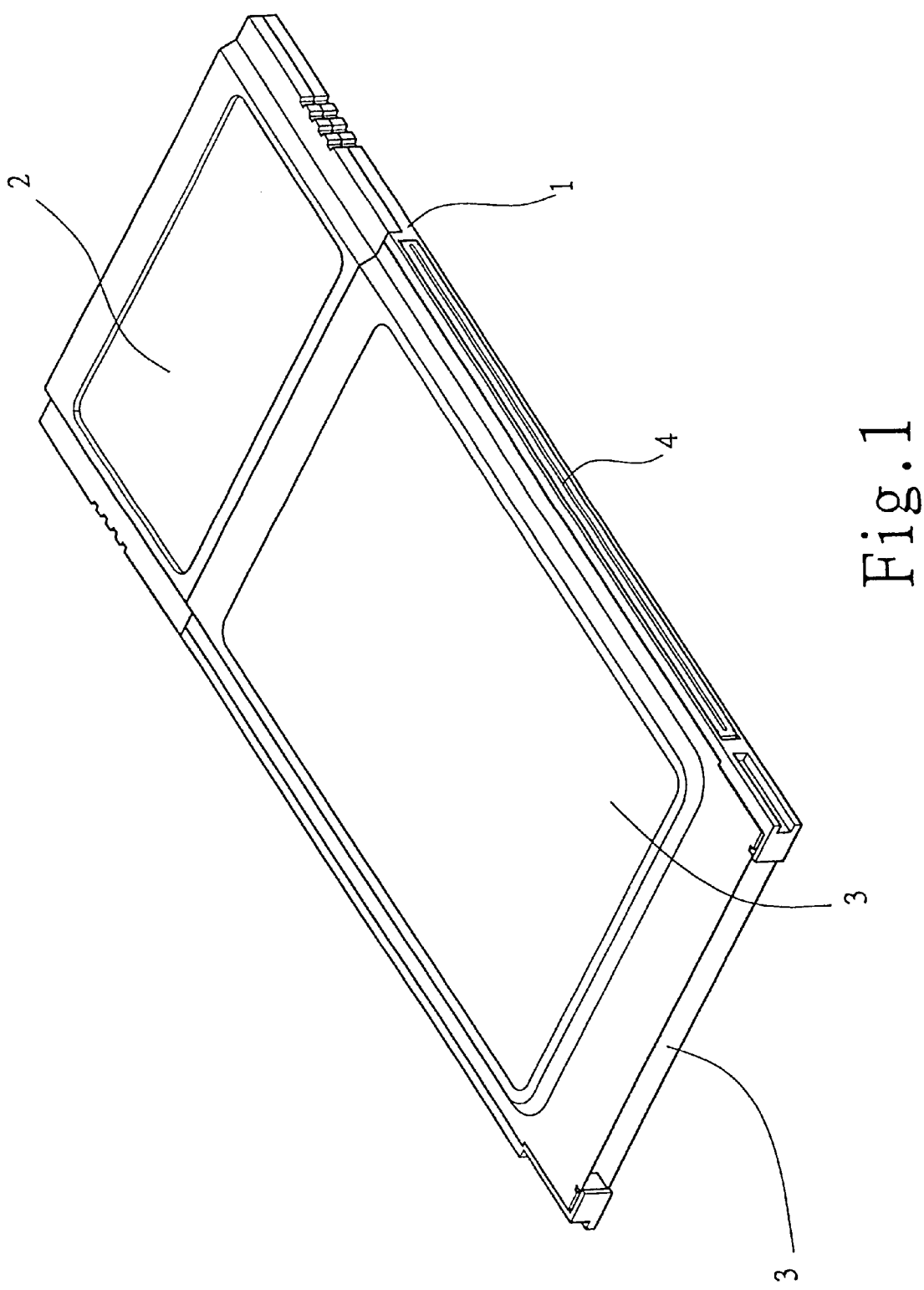
FIG. 1 is a perspective view of the present invention.
Figure 2:
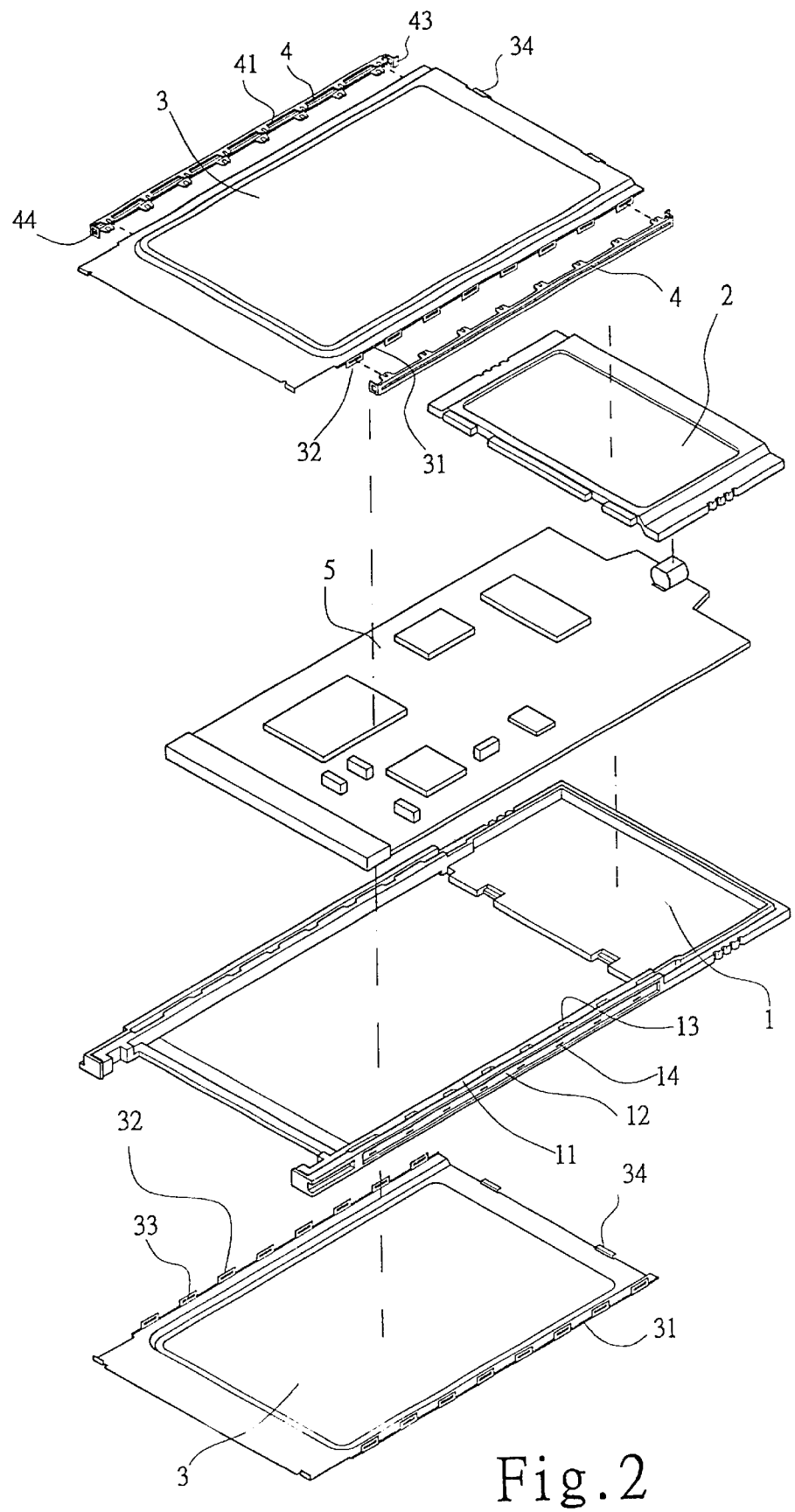
FIG. 2 is an explosive view of the present invention.

The present Referring to FIG.1 & FIG.2, the Network interface card frame in accordance with the present invention primarily includes a plastic frame 1, an upper cover 2, two metal plates 3 and two lateral metal bars 4, wherein the NIC PC board 5 is disposed between the plastic frame 1 and the upper cover 2 and then the plastic frame 1 and the upper cover 2 are jointed together by high frequency heating. Thereafter, the plastic frame 1 with PC board 5 inside is sealed and buckled by two metal plates 3 and two lateral bars 4 hooked to each other.

Figure 3:
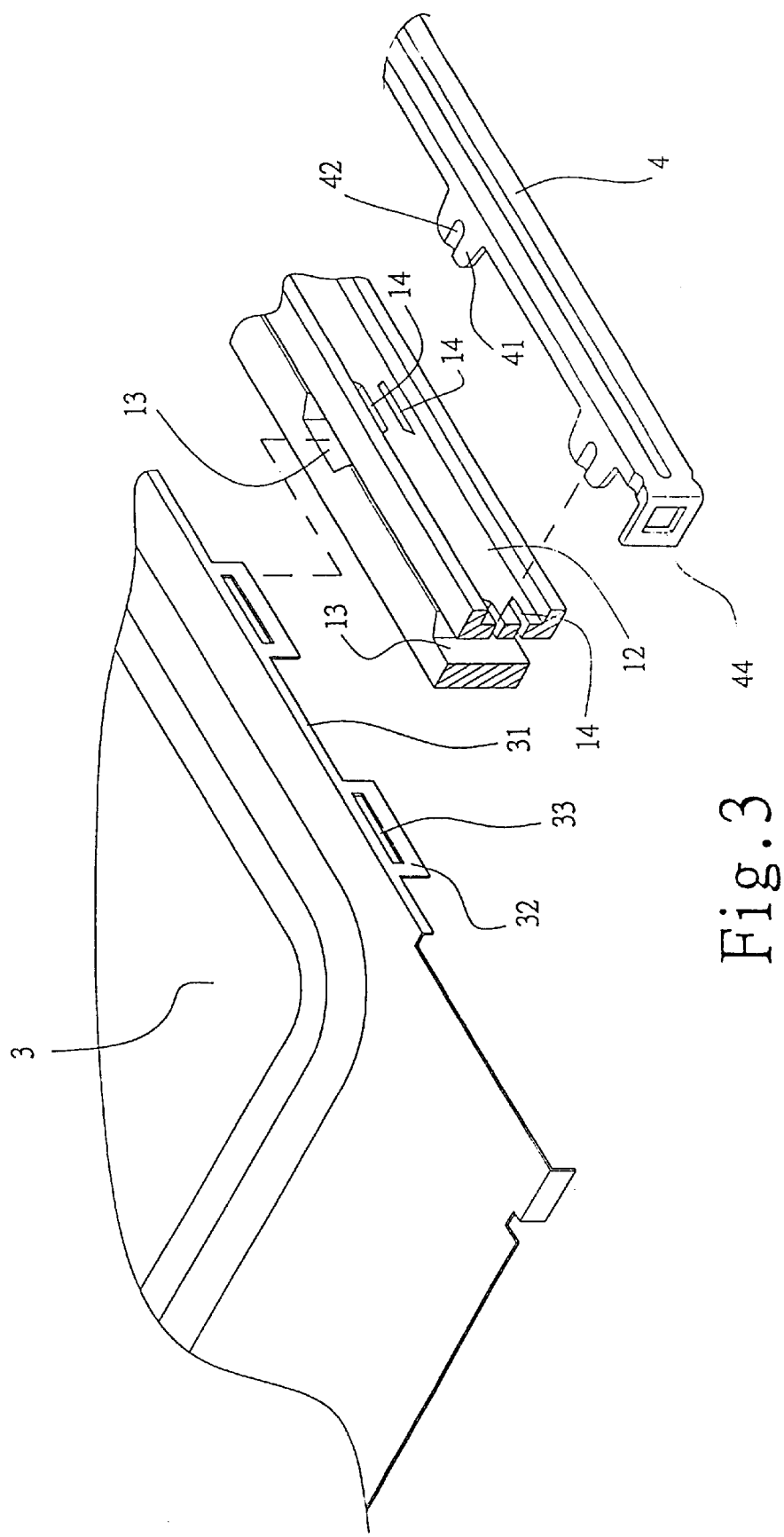
FIG. 3 is a partial explosive view of the present invention.
Figure 4:
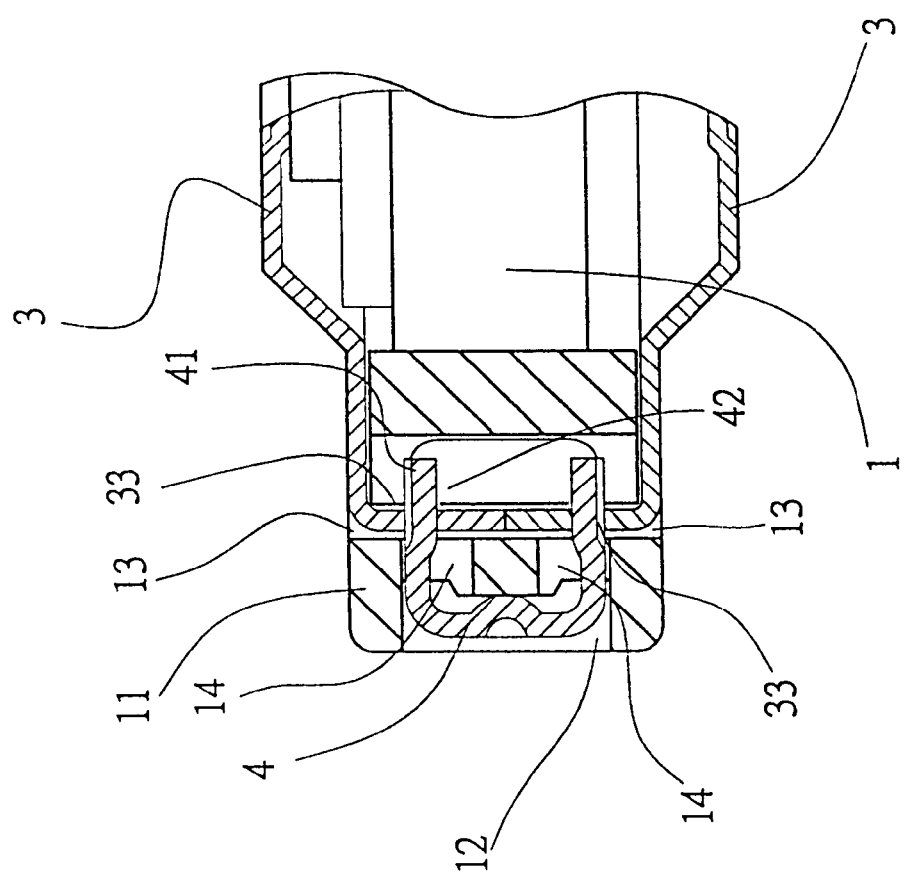
FIG. 4 is a partial sectional view of the lateral edge of the plastic frame of the present invention.

With reference to Fig.2 and Fig.3, a groove 12 is mounted on both lateral sides of the plastic frame 1 and several longitudinal holes 13 cross over the direction of the groove 12 are arranged thereof. On the bottom of the groove 12, several pairs of bilateral hole 14 are mounted thereof, penetrating the lateral side of the plastic frame 1 to reach the above mentioned longitudinal holes 13. On both lateral sides of metal plate 3, a downward folding rim 31 contains several fasten teeth 32 corresponding to each longitudinal holes 13 of the above mentioned plastic frame 1. Each tooth 32 has a buckle hole 33 in the central part. The lateral metal bar 4 is used to fit on the groove 12 of both sides of the plastic frame 1. Several fingers 41 are arranged perpendicular to both edge of the lateral metal bar 4 and corresponding to the buckle holes 33 of metal folding rim 31. The finger 41 has a protruding bead 42 on the center thereof.

Based on the above components, the present invention is assembled by putting NIC PC board 5 on the plastic frame 1, then fastening the upper cover 2 on the PC board 5 into one solid part. Thereafter, the two metal plates 3 is arranged on both side of the plastic frame 1 respectively to protect the NIC PC board 5. Referring to FIG.2, a projecting part 34 is fixed on the top of the metal plate 3 for fitting into the plastic frame 1 and the bottom edge of the upper cover 2. Then the fasten teeth 32 on the folding rim 31 is inserted into the longitudinal holes 13 at the lateral side 11 of the plastic frame 1 individually.

Referring to FIG.3, the fingers 41 of the lateral metal bar 4 is inserted through the bilateral hole 14 on the groove 12 of the plastic frame 1 respectively and then passing through the buckle hole 33 on the fasten tooth 32 mounted inside the longitudinal hole 13 of the plastic frame 1 so as to assist the metal lateral bar 4 fitting firmly into the groove 12 of the plastic frame 1. In addition, a protruding part 43 and a buckle hole 44 are arranged at both end sides of the metal lateral bar 4 in order to enhance the tightness and stability of the present invention. As the structure mentioned above, the whole thickness of the finger 41 and the protruding bead 42 of the side metal bar is a little bit thicker than that of the buckle hole 33 on the fasten tooth 32 of the metal plate 3 so that each finger 41 can be pressed into the corresponding buckle hole 33 and hooked firmly when in assembling. When being taken apart, one side of the lateral metal bar 4 is prized with tools and each finger 41 in turn is moved away from the buckle hole 23. Therefore, the metal plate 3 is removed for the adjustment or maintenance of the NIC PC board 5.

The metal plates 3 are fixed on the plastic frame 1 by fasteners so that the NIC of the present invention can be taken apart without damaging the original structure. Therefore, the components of the present invention can be assembled and dismantled repetitively for adjustment or repairing of the PC board 5 inside the present invention at any time and the extra expenses due to the damage of the plastic frame or the metal plate are also reduced. By the way, the sealing gap between two lateral edges of the metal plates 3 is covered with the lateral metal bar 4 thus the PC board 5 is double protected.

What is claimed is:

1. A network interface card frame primarily comprising a plastic frame, an upper cover, two metal plates and two metal lateral bars, wherein the improvement is characterized by:

said plastic frame having a groove on both outer lateral sides thereof and several longitudinal holes arranged on the top of the lateral side of said plastic frame; several pairs of bilateral hole are mounted on the bottom of said groove, penetrating said lateral side of said plastic frame to reach said longitudinal holes;

said metal plate having a downward folding rim on both sides, said folding rim having several fasten teeth with a buckle hole thereon corresponding to said longitudinal holes of said plastic frame;

said lateral metal bar affixed at said groove of both sides of said plastic frame and several vertical fingers mounted on both edge of said lateral metal bar having a protruding bead thereon and corresponds to the buckle holes of said folding rim;

when being assembled, a PC board of network interface card is mounted into said plastic frame and then two said metal plates are covered on said PC board; afterwards said lateral metal bar is arranged on the groove of the plastic frame and said fingers are inserted into said bilateral holes respectively, penetrating said buckle holes on said fasten teeth of said metal plates so that the protruding bead can be fastened with the buckle hole.

* * * * *